(12) United States Patent
Chen (10) Patent No.: US 12,207,029 B2
(45) Date of Patent: Jan. 21, 2025

(54) HEAT DISSIPATING DEVICE

(71) Applicant: Hitron Technologies Inc., Hsinchu (TW)

(72) Inventor: Hui-Liang Chen, Hsinchu (TW)

(73) Assignee: Hitron Technologies Inc., Hsinchu (TW)

( * ) Notice: Subject to any disclaimer, the term of this patent is extended or adjusted under 35 U.S.C. 154(b) by 173 days.

(21) Appl. No.: 17/937,460

(22) Filed: Oct. 3, 2022

(65) Prior Publication Data
US 2024/0114268 A1    Apr. 4, 2024

(51) Int. Cl.
*H05K 7/20*      (2006.01)
*H04Q 1/02*      (2006.01)

(52) U.S. Cl.
CPC ........... *H04Q 1/035* (2013.01); *H05K 7/2039* (2013.01)

(58) Field of Classification Search
CPC .............................. H04Q 1/035; H05K 7/2039
USPC ........................................................ 361/688
See application file for complete search history.

(56) References Cited

U.S. PATENT DOCUMENTS

| | | | | |
|---|---|---|---|---|
| 4,980,848 A * | 12/1990 | Griffin | ..................... | G06F 1/203 361/679.09 |
| 5,694,293 A * | 12/1997 | Seto | ........................ | G06F 1/203 361/679.46 |
| 5,694,294 A * | 12/1997 | Ohashi | ..................... | G06F 1/203 361/679.48 |
| 5,774,333 A * | 6/1998 | Janik | ...................... | G06F 1/1632 361/679.48 |
| 5,964,279 A * | 10/1999 | Mochizuki | .......... | F28D 15/0275 165/300 |
| 6,069,793 A * | 5/2000 | Maruyama | .............. | G06F 1/203 257/E23.101 |
| 6,877,551 B2 * | 4/2005 | Stoller | ................... | H02B 1/565 165/47 |
| 7,167,358 B2 * | 1/2007 | Iwasaki | ................. | G06F 1/1626 361/679.21 |
| 7,310,227 B2 * | 12/2007 | Kusamoto | .............. | G06F 1/203 361/689 |
| 7,898,805 B2 * | 3/2011 | MacDonald | ........... | G06F 1/203 361/679.48 |
| 8,000,098 B1 * | 8/2011 | Sinha | ..................... | G06F 1/1632 361/679.55 |
| 8,824,142 B2 * | 9/2014 | Jewell-Larsen | .... | H05K 7/20172 361/679.48 |
| 10,264,703 B2 * | 4/2019 | Chen | ...................... | H04B 1/036 |
| 2004/0125558 A1 * | 7/2004 | DiStefano | ............... | G06F 1/203 361/679.48 |
| 2014/0240922 A1 * | 8/2014 | Watanabe | ............. | G06F 1/1656 361/679.54 |
| 2015/0155220 A1 * | 6/2015 | Nguyen | ................ | G06F 1/1656 252/62 |
| 2018/0153057 A1 * | 5/2018 | Chen | .................. | H05K 7/20127 |

* cited by examiner

*Primary Examiner* — Anatoly Vortman
(74) *Attorney, Agent, or Firm* — OPES IP Consulting Co. Ltd.

(57) ABSTRACT

The invention provides a heat dissipating device comprising: a heat generating unit, which generates heat when under operation and is placed at a first side of the heat dissipating device; a heat sensitive object, which is placed at a second side of the heat dissipating device; and an air layer, which is arranged in between the heat generating unit and the heat sensitive object. The heat generated by the heat generating unit is isolated by the air layer.

6 Claims, 11 Drawing Sheets

HEAT DISSIPATING DEVICE

BACKGROUND OF THE INVENTION

Overheated device may bring down the performance of an electronic device. As applications of electronic products become more and more extensive, heat dissipation problem caused by heat consumption and heat insulation problem of internal heat-sensitive elements has become more critical while designing new models, because heat problem may significantly impact device's functional performance.

It is important to know how heat is transferred. Briefly speaking, heat is transferred by conduction, convection or radiation, or by a combination of all three. Heat always moves from warmer to colder areas. That is, heat seeks a balance. If the interior of a space is colder than the outside air, the heat flows from hot area to cold area. As such, the greater the temperature difference, the faster the heat flows to the colder area.

When dealing with large volume heat-sensitive element such as battery cells, the way of isolating heat and space will affect the overall design volume and the following user cases.

SUMMARY OF THE INVENTION

One of the aspects of the present invention is to place a heat-sensitive element under the heat source. By applying an air layer (the term air layer may be interchangeable with other terms such as air barrier, air flow or air wall) to insulate heat conduction and utilizing air convection to dissipate part of heated air which is close to the source, so that to achieve thermal insulation for heat-sensitive element. When a product embodying the present invention is placed upright, the air layer can also be used as a convection and dissipation layer.

According to chimney effect, cold air will enter from the vent below the air layer, that further takes away the heat generated from the heat source and dissipates it through the upper vents, to incur insulation effect for sensitive elements.

One of the purposes of the present invention is to provide a heat dissipating device comprising: a heat generating unit, which generates heat when under operation and is placed at a first side of the heat dissipating device; a heat sensitive object, which is placed at a second side of the heat dissipating device; and an air layer, which is arranged in between the heat generating unit and the heat sensitive object. The heat generated by the heat generating unit is isolated by the air layer.

Preferably, the first side of the heat dissipating device includes a plurality of vents.

Preferably, the heat generated by the heat generating unit is dissipated through the plurality of vents.

Preferably, the heat generating unit is an IC.

Preferably, the heat sensitive object is a battery.

Preferably, the heat dissipating device is a router, a modem, or an access point.

DETAILED DESCRIPTION OF THE INVENTION

Unless defined otherwise, all technical and scientific terms used herein have the same meanings as commonly understood by one of skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the features, structures, or characteristics may be combined in any suitable manner in one or more embodiments.

In sophisticated products such as 3C products, the main heating source is usually generated from integrated chips (ICs) soldered on printed circuit board (PCB). To prevent from overheating, heat dissipation is one of the main factors that has to be taken care of. Further, the heating IC also need to be isolated from sensitive element. A common thermal element is battery core.

The present invention relates to a heat dissipating device, and more particularly, to a device in which an air layer is built in for isolating heat source from heat sensitive object.

Figure 1:
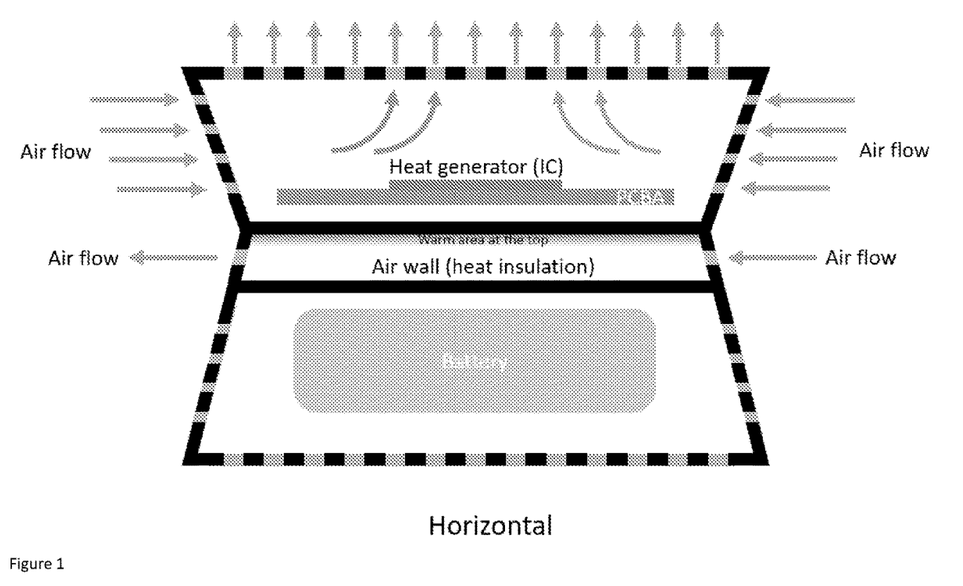
FIG. 1 illustrates a first embodiment of the present invention.

Reference is made to FIG. 1, which illustrates a first embodiment of the present invention and in which an IC and a battery cell are taken for an example to illustrate the structural configuration of the present invention.

Referring to FIG. 1, the PCB and IC are placed on the upper inside of a device. The IC is mounted on top of the PCB. The battery cell is placed at the lower side of the device. A space is reserved to the middle of the device, functioning as an air layer.

Moreover, the outside of the device is covered with ventilation holes to keep air convection between external and internal of the device.

Since the heat source is placed at the top side, most of the heat generated will be dissipated through the above of the device by air convection, leaving only a part of the heat which will be accumulating below the heat source. This part of heat will be directly conducted to the air layer.

Air is an excellent heat conduction insulator and is also a good convection fluid. In the air layer of the device, there are also vents around the device walls so that internal air can be exchanged with outside air to dissipate heat and prevent heat conduction to the battery cell at the lower side of the device.

Figure 2:
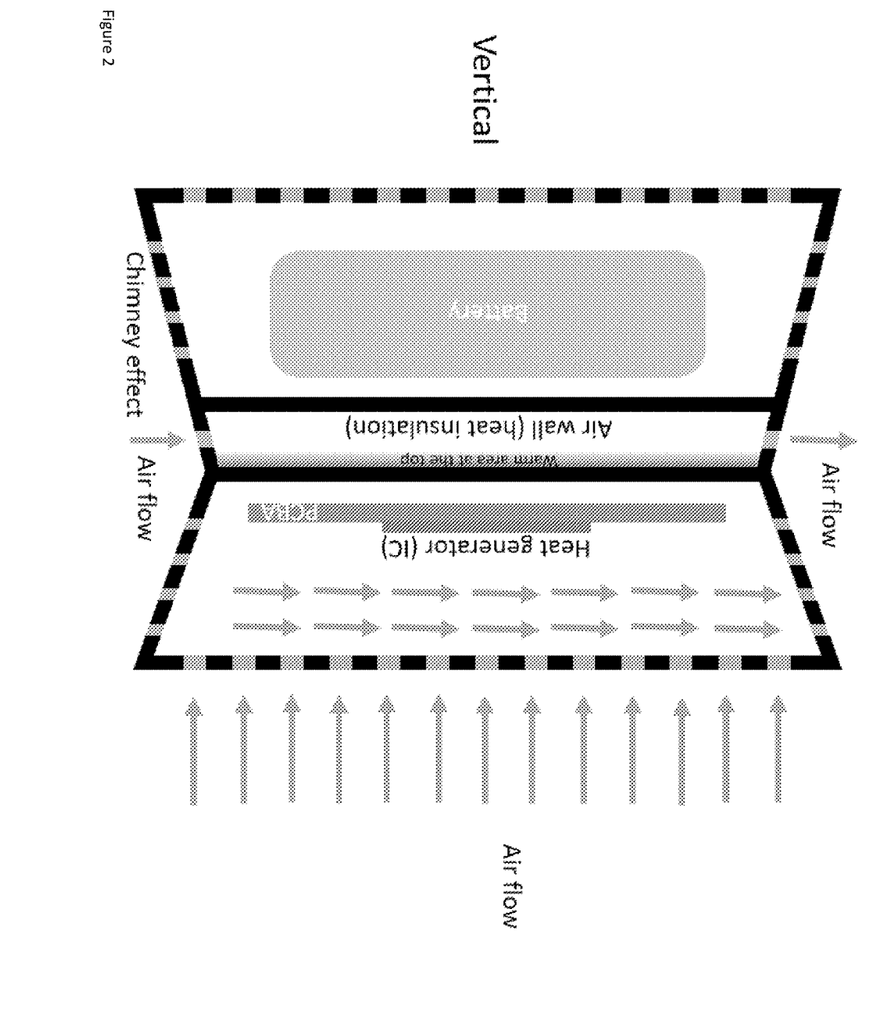
FIG. 2 illustrates a second embodiment of the present invention.

Reference is next made to FIG. 2, which illustrates a second embodiment of the present invention when the device is placed upright, the IC and battery cell are arranged at both sides of the device, and are separated by the air layer. Therefore, a portion of the heat will be dissipated at the IC side, and the rest will be dissipated by convection of air layer from bottom to top. As a result, the heat cannot be dissipated to the battery cell, which implicated that the heat will be insulated from the battery cell.

The present invention is implemented utilizing passive heat dissipation and/or heat insulation, which separates the heating elements and the heat sensitive elements in two different spaces, without using active heat dissipation methods or heat dissipation elements, such as fans, cooling pipes, etc.

An embedded multimedia terminal adapter (eMTA) device with 3 air layers to insulate the heat conduction will be explained with the relevant figures accompanied.

Figure 3:
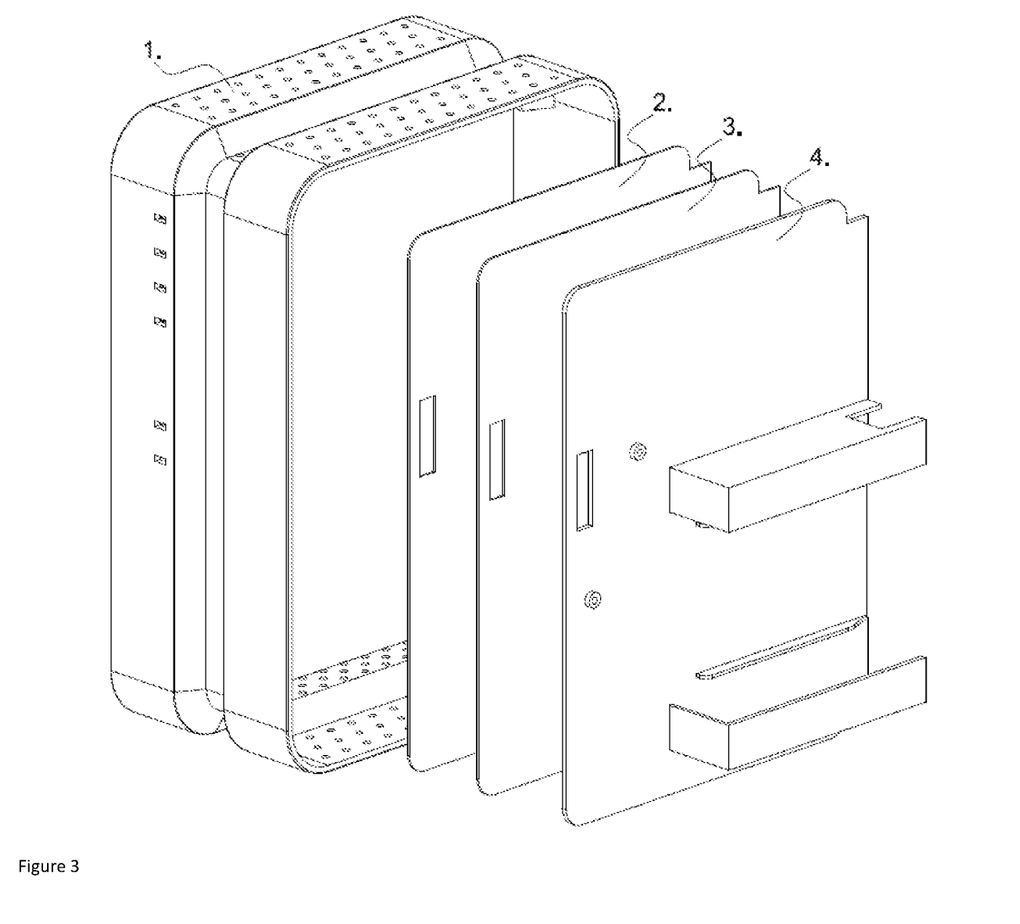
FIG. 3 illustrates an (embedded multimedia terminal adapter) eMTA device with three air layers to insulate the heat conduction.

Reference is made to FIG. 3, which illustrates the eMTA device with three air layers to insulate the heat conduction. As shown in FIG. 3, the eMTA device has a body case 1, a first isolation board 2, a second isolation board 3 and an isolation board with battery slot 4.

Reference is collectively made to FIGS. 4-8, which are assembly illustration view of the eMTA device shown in FIG. 3.

Figure 4:
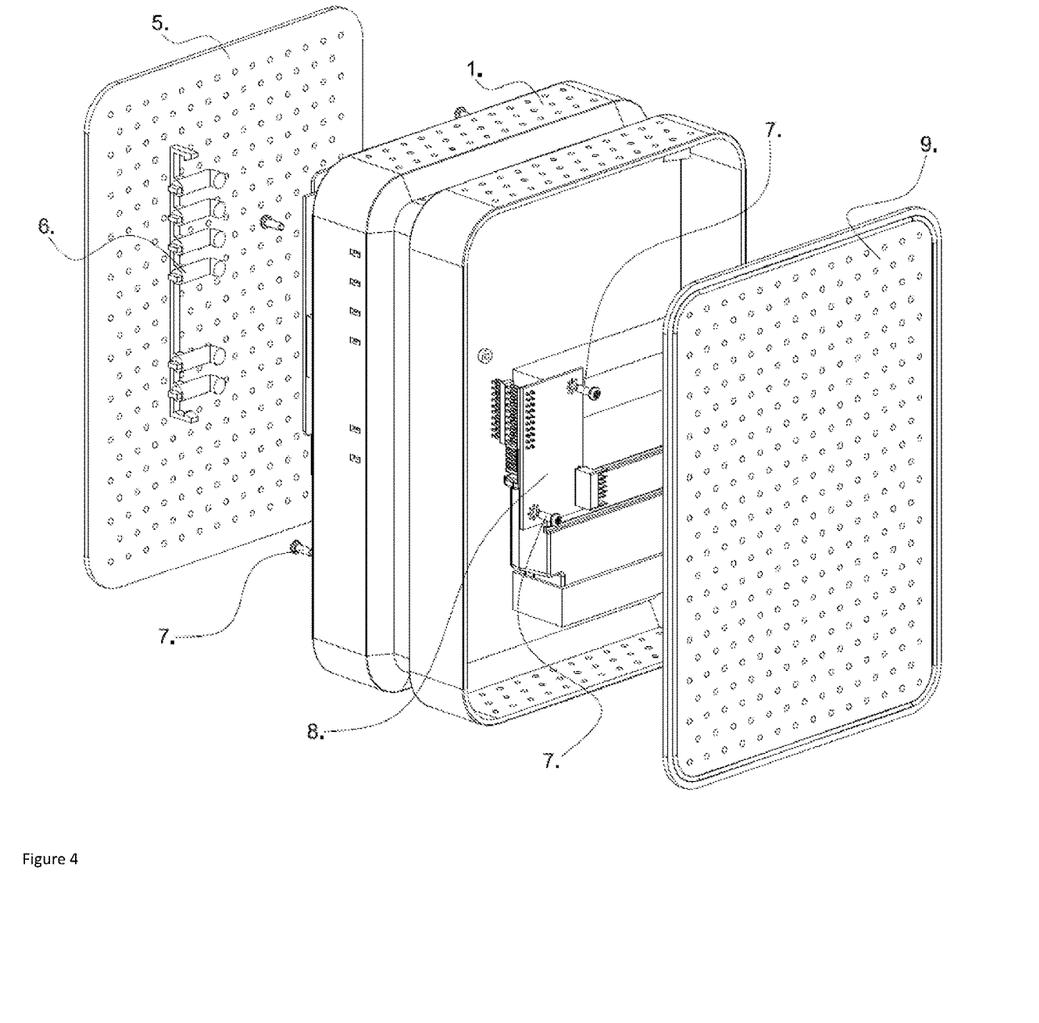
FIG. 4 illustrates a first embodiment of the eMTA device.

Referring to FIG. 4, which illustrates a first embodiment of the eMTA device. The eMTA device of the first embodiment further includes a top lid 5 on which light pipe 6 is provided, a screws 7, a bridge PC board 8, a bottom lid 9.

Figure 5:
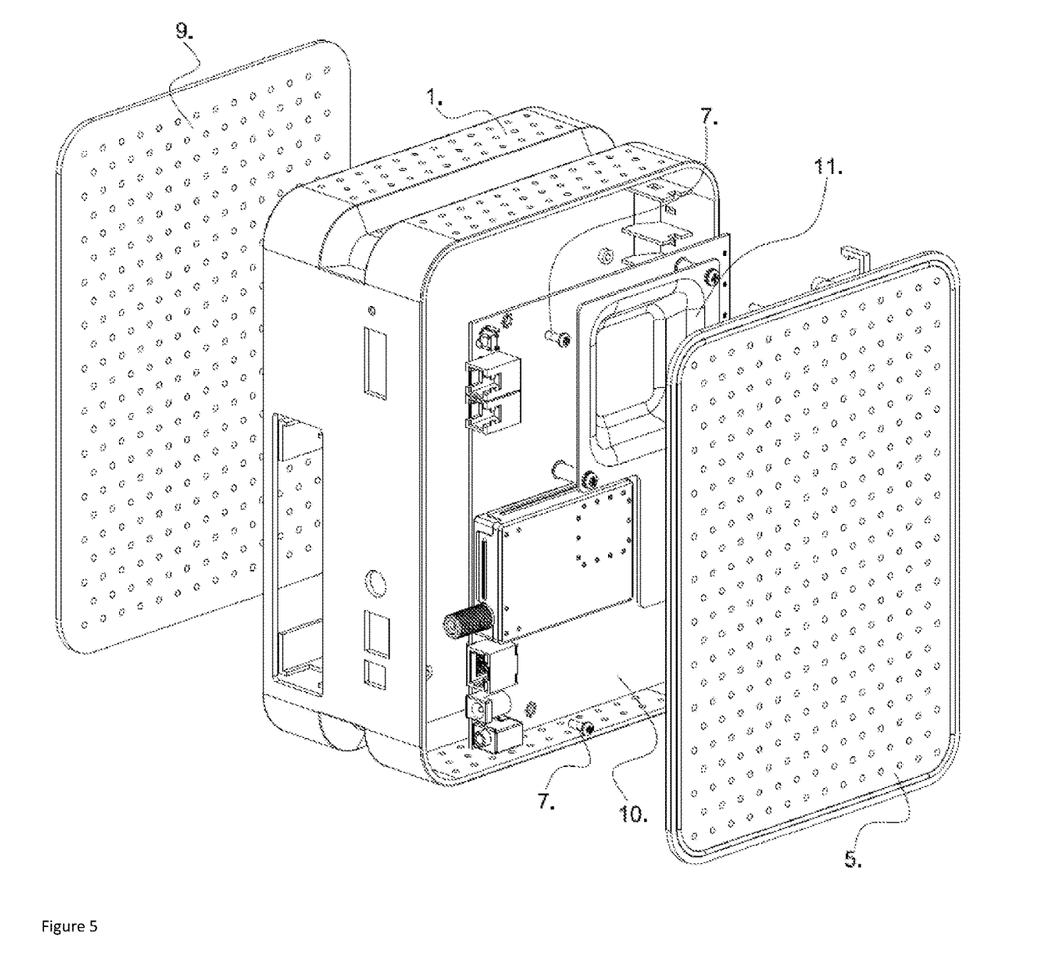
FIG. 5 illustrates a second embodiment of the eMTA device.

Referring to FIG. 5, which illustrates a second embodiment of the eMTA device. The eMTA device of the second embodiment further includes a main PCB board assembly 10 and a heat sink 11.

Figure 6:
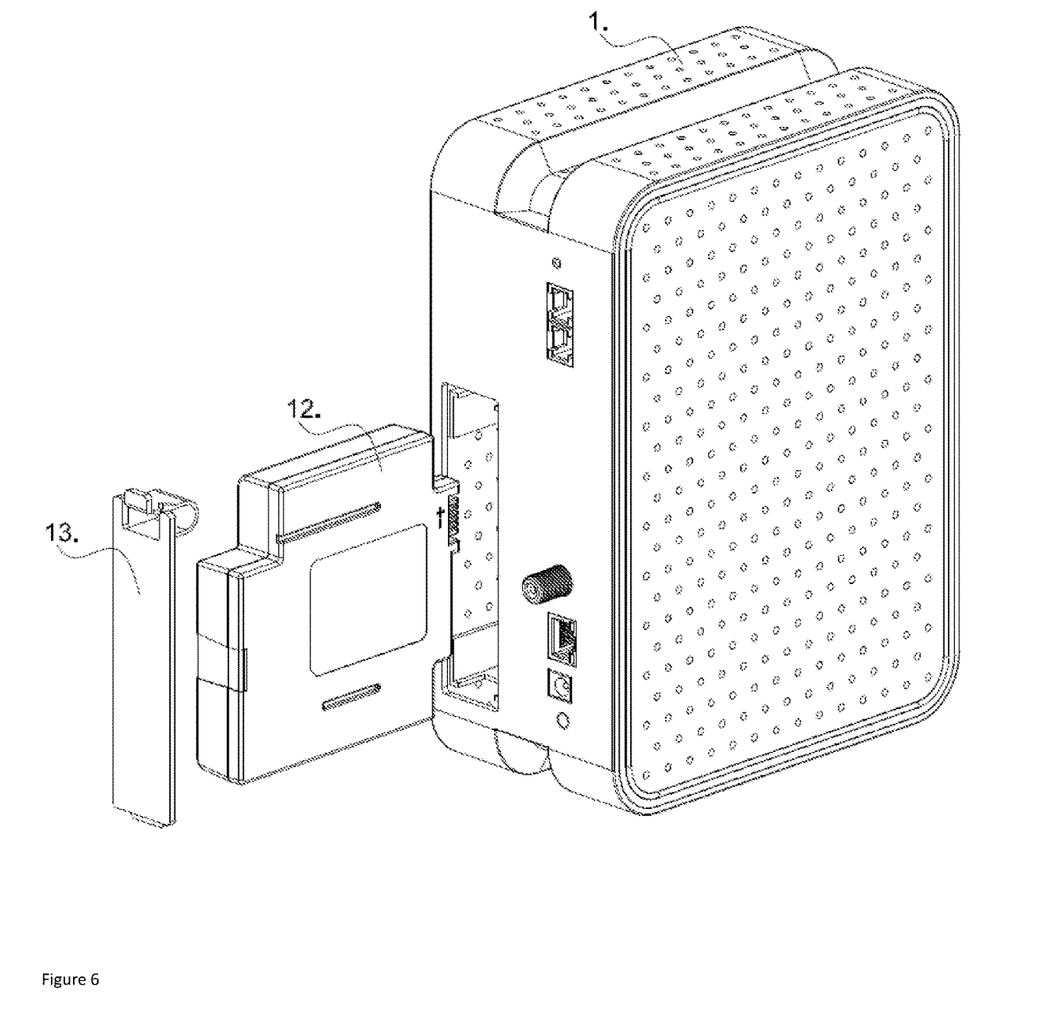
FIG. 6 illustrates a third embodiment of the eMTA device.

Referring to FIG. 6, which illustrates a third embodiment of the eMTA device. The eMTA device of the third embodiment further includes battery pack unit 12 and a battery door 13.

Figure 7:
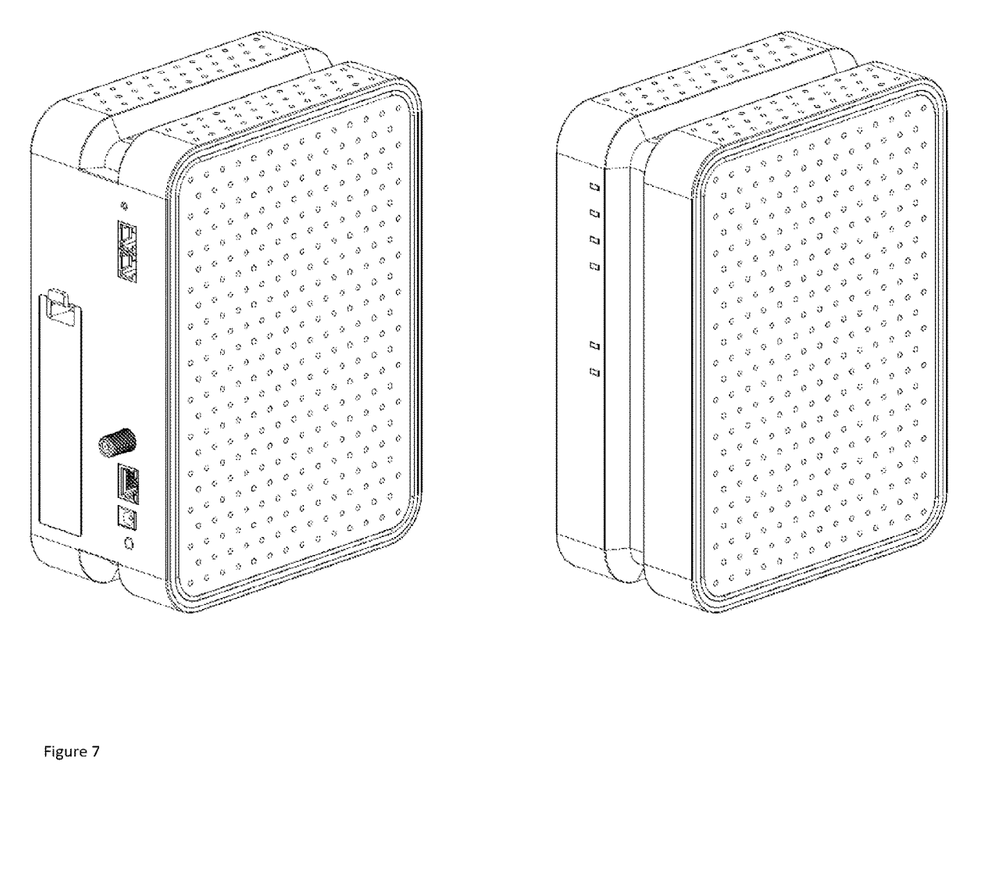
FIG. 7 illustrates the eMTA device viewed from different perspective.

Referring to FIG. 7, which illustrates the eMTA device viewed from different perspective.

Figure 8:
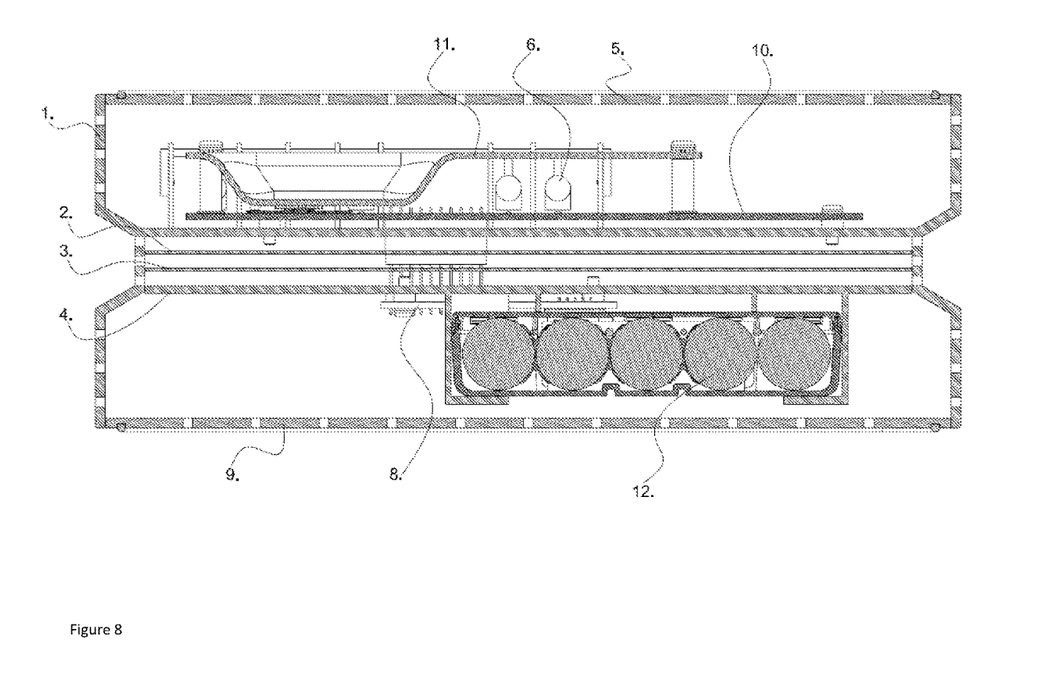
FIG. 8 shows the internal view of the eMTA device.

Referring to FIG. 8, which shows the internal view of the eMTA device. As can be seen from FIG. 8, the eMTA device has the body case 1, the first isolation board 2, the second isolation board 3, the isolation board with battery slot 4, the top lid 5 on which light pipe 6 is provided, the bridge PC board 8, the bottom lid 9, the main PCB board assembly 10, the heat sink 11 and the battery pack unit 12.

Figure 9:
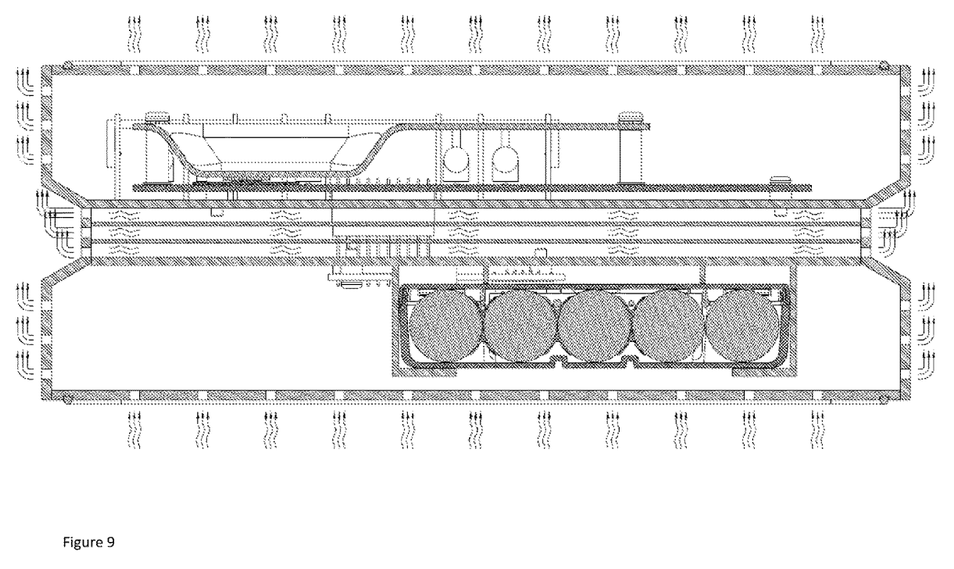
FIG. 9 is a first illustration for the air flow of the eMTA device.
Figure 10:
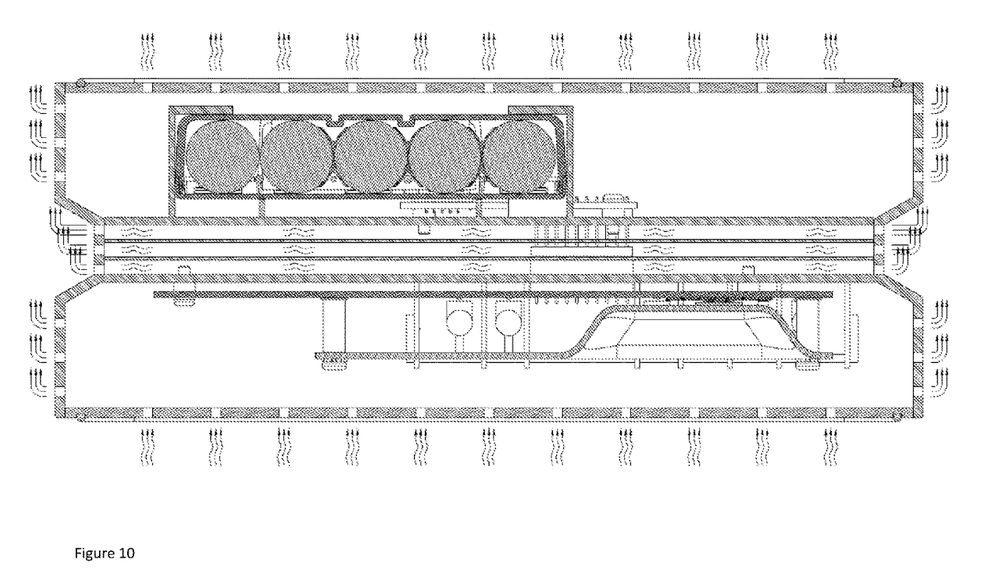
FIG. 10 is a second illustration for the air flow of the eMTA device.
Figure 11:
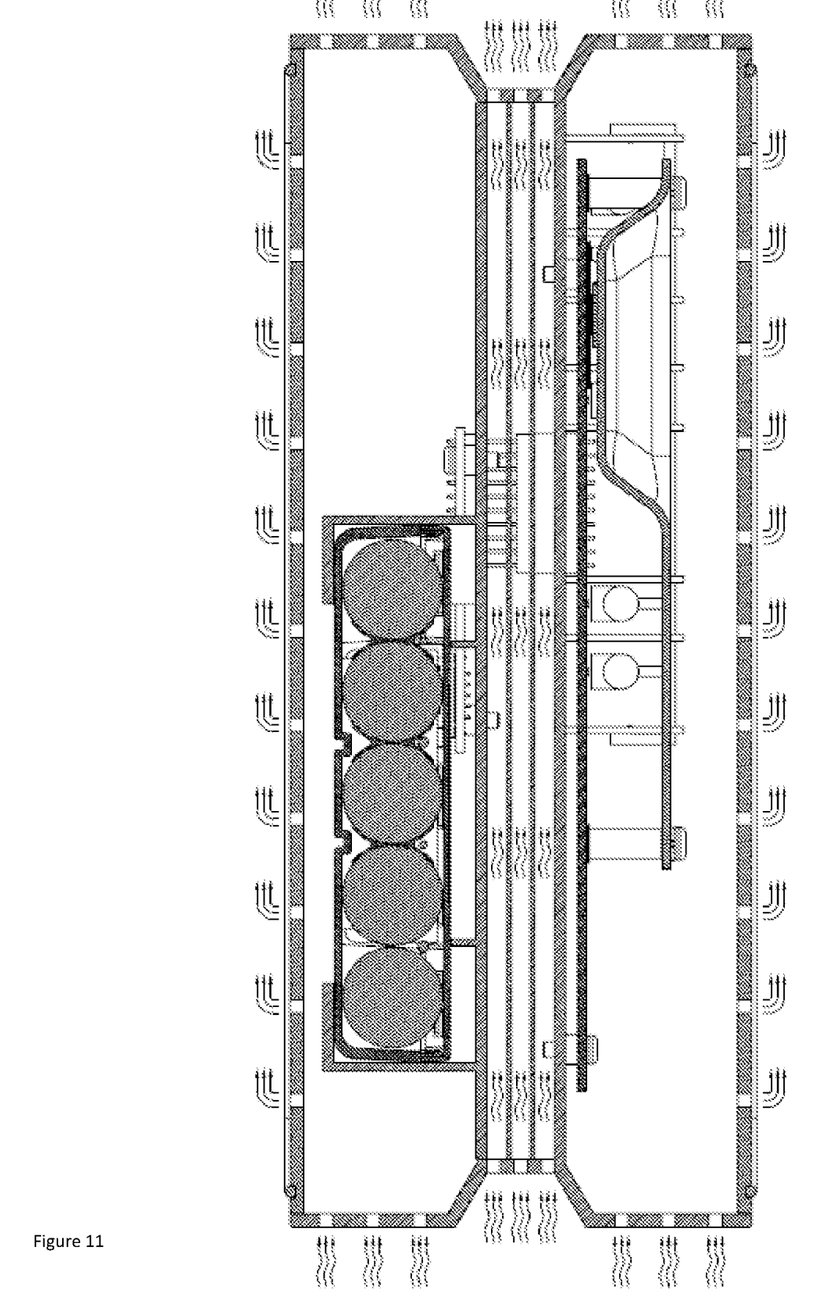
FIG. 11 is a third illustration for the air flow of the eMTA device.

Further, reference is next made to FIGS. 9-11, where FIG. 9 is a first illustration for the air flow of the eMTA device, FIG. 10 is a second illustration for the air flow of the eMTA device and FIG. 11 is a third illustration for the air flow of the eMTA device.

As shown in FIGS. 9-11, the estimated air flow for device in horizontal will be shown in FIGS. 9 and 10. The estimated air flow for device in vertical will be shown in FIG. 11.

In sum, the present invention may be applied on telecom products, such as routers, modems, access points such as Wi-Fi access points (Wi-Fi APs) and etc.

In sum, the present invention may also be applied on other electronic or wireless devices, such as thermal devices, hot objects, PCBs, heat-sensitive devices, and etc.

In sum, the heat insulation between heating sources and heat sensitive elements inside device is designed with air layers in the present invention, by utilizing low air thermal conductivity. Air layers can be a single layer or, a variation, multiple air layer.

In sum, the isolation boards for among air layers cannot touch each other against heat transferring from board to board.

One of the main purposes of the present invention is to solve thermal issue between hot objects and heat-sensitive parts by an airflow (the following terms can also be interchangeable with airflow: air barrier, air layers). Such airflow will block the heat conduction path from hot objects to heat-sensitive parts when product is horizontally arranged/disposed. Airflow will dissipate heat from bottom to top because of chimney effect when product is vertical.

The invention claimed is:

1. A heat dissipating device, comprising:
a heat generating unit, which generates heat when under operation and is placed at a first side of the heat dissipating device;
a heat sensitive object, which is placed at a second side of the heat dissipating device; and
an air layer, which is arranged in a compartment between the first side and the second side of the heat dissipating device, wherein the compartment is defined by a top wall, a bottom wall opposing the top wall, and internal isolation boards contacting both the top wall and the bottom wall, and each of the top wall and the bottom wall includes a plurality of vents;
wherein the heat generated by the heat generating unit is isolated from the heat sensitive object by the air layer, and the heat is dissipated through the plurality of vents on the top wall by convection of the air layer when the heat dissipating device stands upright.

2. The heat dissipating device as claim 1, wherein the first side of the heat dissipating device includes a plurality of vents.

3. The heat dissipating device as claim 2, wherein the heat generated by the heat generating unit is dissipated through the plurality of vents.

4. The heat dissipating device as claim 1, wherein the heat generating unit is an IC.

5. The heat dissipating device as claim 1, wherein the heat sensitive object is a battery.

6. The heat dissipating device as claim 1, wherein the heat dissipating device is a router, a modem, or an access point.

* * * * *